(12) United States Patent
Nie et al.

(10) Patent No.: US 11,366,134 B2
(45) Date of Patent: Jun. 21, 2022

(54) LIGHTNING-PROOF PIEZOELECTRIC ACCELERATION SENSOR

(71) Applicant: FATRI (Xiamen) Technologies, Co., Ltd., Xiamen (CN)

(72) Inventors: Yongzhong Nie, Xiamen (CN); Chengxu Luo, Xiamen (CN)

(73) Assignee: FATRI UNITED TESTING & CONTROL (QUANZHOU) TECHNOLOGIES CO., LTD., Quanzhou (CN)

( * ) Notice: Subject to any disclaimer, the term of this patent is extended or adjusted under 35 U.S.C. 154(b) by 179 days.

(21) Appl. No.: 16/858,832

(22) Filed: Apr. 27, 2020

(65) Prior Publication Data

US 2021/0011050 A1 Jan. 14, 2021

(30) Foreign Application Priority Data

Jul. 8, 2019 (CN) .......................... 201921057975.2

(51) Int. Cl.
| | |
|---|---|
| G01P 15/09 | (2006.01) |
| G01P 15/08 | (2006.01) |
| H01L 41/187 | (2006.01) |
| H01L 41/053 | (2006.01) |
| H01L 41/113 | (2006.01) |

(52) U.S. Cl.
CPC .......... *G01P 15/09* (2013.01); *G01P 15/0802* (2013.01); *H01L 41/0533* (2013.01); *H01L 41/1132* (2013.01); *H01L 41/187* (2013.01)

(58) Field of Classification Search
CPC .. G01P 15/09; G01P 15/0907; G01P 15/0922; G01P 15/0802; H01L 41/0533; H01L 41/1132; G01L 41/187
See application file for complete search history.

(56) References Cited

U.S. PATENT DOCUMENTS 4,604,544 A * 8/1986 Konomi .................. G01L 19/02
  310/338
5,415,026 A * 5/1995 Ford ...................... G01H 11/06
  73/651

(Continued)

FOREIGN PATENT DOCUMENTS

CN 208459424 U 2/2019

*Primary Examiner* — Helen C Kwok
(74) *Attorney, Agent, or Firm* — Amster, Rothstein & Ebenstein LLP

(57) ABSTRACT

The present application relates to the technical field of sensors, and particularly relates to a lightning-proof piezoelectric acceleration sensor which comprises a housing, a core assembly, an insulation sheet, a shielding cover, a lightning-proof circuit board and a heat-shrinkable sleeve, the core assembly is provided inside the housing, the insulation sheet has one end fixedly connected to the core assembly and the other end fixedly connected to an inner wall of the housing, the shielding cover is sleeved outside the core assembly and has an open end oriented towards the insulation sheet, the lightning-proof circuit board is fixedly provided on an upper end of the shielding cover and is electrically connected to an external connector and the core assembly respectively, the heat-shrinkable sleeve is sleeved outside the shielding cover and has a lower end connected to the housing and an upper end situated higher than the shielding cover.

10 Claims, 3 Drawing Sheets

(56) References Cited

U.S. PATENT DOCUMENTS

2020/0303617 A1\* 9/2020 Nie ...................... H01L 41/053
2021/0011051 A1\* 1/2021 Nie ..................... H01L 41/1132
2021/0018344 A1\* 1/2021 Nie ....................... H02H 9/044

\* cited by examiner

LIGHTNING-PROOF PIEZOELECTRIC ACCELERATION SENSOR

CROSS REFERENCE

This application is based upon and claims priority to Chinese Patent Application No. 2019210579752, filed on Jul. 8, 2019, titled "LIGHTNING-PROOF PIEZOELECTRIC ACCELERATION SENSOR", and the entire contents of which are incorporated herein by reference.

TECHNICAL FIELD

The present application relates to the technical field of sensors, and particularly relates to a lightning-proof piezoelectric acceleration sensor.

BACKGROUND

The working principle of piezoelectric sensors is to realize mutual conversion between mechanical energy and electric energy based on the piezoelectric effect of some dielectric material. Piezoelectric sensors are widely used, wherein a sensor that measures acceleration is called a piezoelectric acceleration sensor.

The existing piezoelectric acceleration sensor is mainly composed of a piezoelectric member, a mass block, a pre-pressing spring, a base member and a housing, and while being used, the piezoelectric acceleration sensor is fixed on a measured object, when the piezoelectric acceleration sensor and the measured object together are subjected to impact vibration, the piezoelectric member is subjected to an inertia force of the mass block, this inertia force acted on the piezoelectric member causes the piezoelectric member to generate electric charge, the outputted electric charge is directly proportional to the acceleration, therefore, the size of the acceleration can be known from the electric charge outputted by the acceleration sensor.

In prior art, the Chinese Patent Literature CN208459424U discloses a piezoelectric acceleration sensor comprising a housing, a regulating structure and an electric charge output structure, the housing is formed with a mounting cavity therein, and a cable connector is provided on a side surface of the housing; the regulating structure position-adjustably connects the housing to the measured object, so as to be able to adjust the relative position between the measured object and the cable connector; the electric charge output structure is mounted inside the mounting cavity for detecting vibration and outputting electric signal, the electric charge output structure is electrically connected to the cable connector. The above-mentioned piezoelectric acceleration sensor can meet the function of measuring the size of acceleration. But, in actual use, because the working environment is complicated, especially when applied in situations of electric power system, aviation industry or railway transportation, the piezoelectric acceleration sensor is susceptible to lightning strike and all kinds of electric discharge interferences, therefore, the piezoelectric acceleration sensor should also have good lightning-proof effect.

SUMMARY OF THE APPLICATION

Thus, the present application provides a piezoelectric acceleration sensor that has lightning-proof function and good lightning-proof effect.

The technical solution of the present application is as follows:

A lightning-proof piezoelectric acceleration sensor, comprising a housing, a core assembly, a shielding cover and a shielding cover, wherein the core assembly is provided inside the housing, the insulation sheet has one end fixedly connected to the core assembly and the other end fixedly connected to an inner wall of the housing, the shielding cover is sleeved outside the core assembly and has an open end oriented towards the insulation sheet; further comprising a lightning-proof circuit board and a heat-shrinkable sleeve, wherein the lightning-proof circuit board is fixedly provided on an upper end of the shielding cover and is electrically connected to an external connector and the core assembly respectively, the heat-shrinkable sleeve is sleeved outside the shielding cover and has a lower end connected to the housing and an upper end situated higher than the shielding cover, and insulation material having a preset height is filled between the heat-shrinkable sleeve and the housing.

An upper end of the insulation material is situated above the shielding cover.

The lightning-proof circuit board comprises a Transient Voltage Suppressor (TVS) tube, a gas discharge tube and a resistor integrated thereon.

The insulation sheet is alumina ceramics.

A preset gap is provided between an upper end of the shielding cover and the core assembly, a through-hole is provided in the upper end of the shielding cover, and a connection wire connecting the lightning-proof circuit board to the core assembly passes through the through-hole.

The core assembly comprises a base member, a piezoelectric member, a mass block member, a pre-tightening member and a locking member, wherein the base member is fixedly connected to one end of the insulation sheet and comprises a support portion and a columnar connection portion arranged on the support portion and provided with a mounting hole extending along an axis thereof, the piezoelectric member is sleeved outside the connection portion with an annular gap formed between the piezoelectric member and the connection portion, the mass block member is sleeved outside the piezoelectric member with no clearance formed therebetween and forms a clearance with the shielding cover, the pre-tightening member, being a wedge block, is inserted in the annular gap and has a thinner end close to the support portion, the locking member comprises a columnar part cooperating with the mounting hole to lock the base member, the piezoelectric member, the mass block member and the pre-tightening member and a stopper part connected to columnar part and pressing on one end of the pre-tightening member so as to cause the pre-tightening member to apply a radial pre-tightening force to tighten the piezoelectric member, the mass block member and the base member.

An inner annular surface of the pre-tightening member has a shape of a circular truncated cone with a slope of 86-88 degrees.

The support portion has a diameter size equal to that of the insulation sheet, both a peripheral wall of the support portion and a peripheral wall of the insulation sheet are connected with the heat-shrinkable sleeve.

A lower end of the support portion is an annular flange, and the open end of the shielding cover abuts against a flange surface of the annular flange.

The shielding cover is welded to the support portion.

The technical solution of the present application has the following advantages:

1. The lightning-proof piezoelectric acceleration sensor of the present application comprises a housing, a core assembly, an insulation sheet, a shielding cover, a lightning-proof circuit board and a heat-shrinkable sleeve, the insulation sheet has one end fixedly connected to the core assembly and the other end fixedly connected to an inner wall of the housing, so that there is enough creepage distance between the core assembly and the inner wall of the housing; the shielding cover is sleeved outside the core assembly and has an open end oriented towards the insulation sheet, so that the shielding cover together with the insulation sheet encloses the core assembly for resisting external electromagnetic noises; the lightning-proof circuit board for clamping surge voltage is fixedly provided on an upper end of the shielding cover, so that the lightning-proof piezoelectric acceleration sensor has a compact structure; the heat-shrinkable sleeve is sleeved outside the shielding cover and has a lower end connected to the housing and an upper end situated higher than the shielding cover, so that the creepage distance between the housing and the shielding cover is increased; insulation material having a preset height is filled between the heat-shrinkable sleeve and the housing, the reason for the preset height thereof is to ensure the core assembly can be sufficiently wrapped by glue material, so as to avoid the risk of electric breakdown due to insufficient insulation, the insulation material further increases the creepage distance between the housing and the shielding cover, therefore, the lightning-proof piezoelectric acceleration sensor has even better lightning-proof effect.

2. In the lightning-proof piezoelectric acceleration sensor of the present application, the lightning-proof circuit board comprises a TVS tube, a gas discharge tube and a resistor, wherein the TVS tube clamps surge voltage to 22V, the gas discharge tube absorbs large current inputted from outside, the resistor absorbs residual voltage, the TVS tube, the gas discharge tube and the resistor are integrated on the circuit board, so that the lightning-proof elements have a compact structure.

3. In the lightning-proof piezoelectric acceleration sensor of the present application, the insulation sheet is alumina ceramics, the alumina ceramics has good mechanical strength, so that damage due to vibration and impact can be prevented when measuring acceleration.

4. In the lightning-proof piezoelectric acceleration sensor of the present application, a preset gap is provided between an upper end of the shielding cover and the core assembly, so that the shielding cover does not interfere with the core assembly.

5. In the lightning-proof piezoelectric acceleration sensor of the present application, the core assembly comprises a base member, a piezoelectric member, a mass block member, a pre-tightening member and a locking member, the base member comprises a support portion and a columnar connection portion arranged on the support portion, the connection portion is provided with a mounting hole extending along an axis thereof, the locking member comprises a columnar part and a stopper part connected to each other, and when mounting the core assembly, the columnar part cooperating with the mounting hole to lock the base member, the piezoelectric member, the mass block member, the pre-tightening member and the locking member together, and as the pre-tightening member is a wedge block inserted in the annular gap formed between the piezoelectric member and the connection portion, when pressed by the stopper part, the pre-tightening member causes the piezoelectric member and the mass block member to be tightly connected, thus, when using the core assembly, an inertia force of the mass block member is acted on the piezoelectric member to generate electric charge; because there is a clearance between the mass block member and the shielding cover, the shielding cover can be prevented from interfering with the mass block member.

6. In the lightning-proof piezoelectric acceleration sensor of the present application, an inner annular surface of the pre-tightening member has a shape of a circular truncated cone with a slope of 86-88 degrees. When a certain force is acted by the stopper part on the wedge block, a larger angle of slope makes it easier for the wedge block to be inserted into the annular gap, and analysis shows that the lightning-proof piezoelectric acceleration sensor has optimal performance when the circular truncated cone has a slope of 86-88 degrees.

7. In the lightning-proof piezoelectric acceleration sensor of the present application, the open end of the shielding cover abuts against a flange surface of the annular flange, so that the clearance between the shielding cover and the base member is reduced, which is beneficial for resisting external electromagnetic noises; meanwhile, it is convenient for mounting and welding the shielding cover to the base member, so as to achieve convenient assembling.

BRIEF DESCRIPTION OF THE DRAWINGS

In order to more clearly describe the technical solutions in the specific embodiments of the present application or in the prior art, hereinafter, the appended drawings used for describing the specific embodiments or the prior art will be briefly introduced. Apparently, the appended drawings described below are only some embodiments of the present application, and for a person with ordinary skill in the art, without expenditure of creative labor, other drawings can be derived from these appended drawings.

REFERENCE SIGNS

1—upper cover; 2—lightning-proof circuit board; 3—heat-shrinkable sleeve; 4—shielding cover; 5—signal conditioning circuit board; 6—locking member; 7—piezoelectric member; 8—mass block member; 9—insulation silica gel; 10—support portion; 11—connection portion; 12—alumina ceramics; 13—flange surface; 14—housing; 15—high-voltage endurance double-core connector; 16—wedge block.

DETAILED DESCRIPTION OF EMBODIMENTS

A clear and complete description of the technical solution of the present application is given below, in conjunction with the appended drawings. Apparently, the described embodiments are part of, but not all of, the embodiments of the present application. All the other embodiments, obtained by a person with ordinary skill in the art from the embodiments in the present application without expenditure of creative labor, belong to the protection scope of the present application.

In the description of the present application, it should be noted that, terms such as "center", "above", "below", "left", "right", "vertical", "horizontal", "inside", "outside" refer to the orientation or positional relationship based on the illustration of the appended drawings, and are only for the purpose of facilitating and simplifying the description of the present application, rather than indicating or implying that the apparatus or component referred to must have a particular orientation or must be configured or operated in a particular orientation, therefore should not be construed as a limitation towards the present application. In addition, terms such as "first", "second", "third" are merely for the purpose of description and should not be construed as an indication or implication of relative importance thereof.

Figure 1:
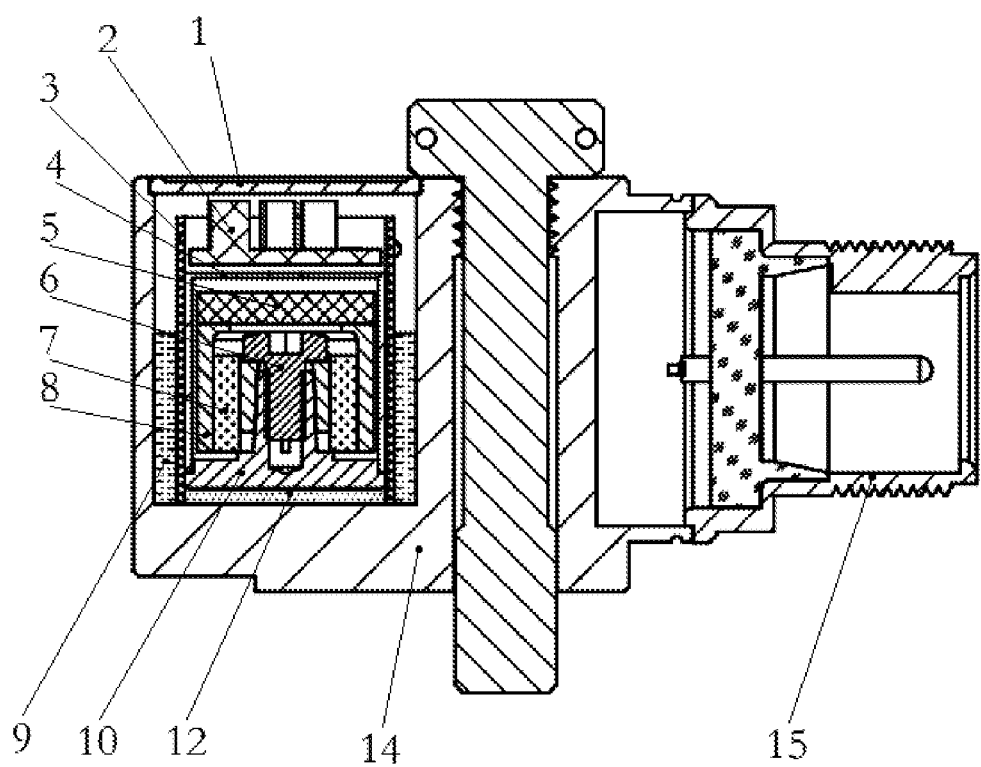
FIG. 1 is a structural schematic diagram of a cross section view of the lightning-proof piezoelectric acceleration sensor.
Figure 2:
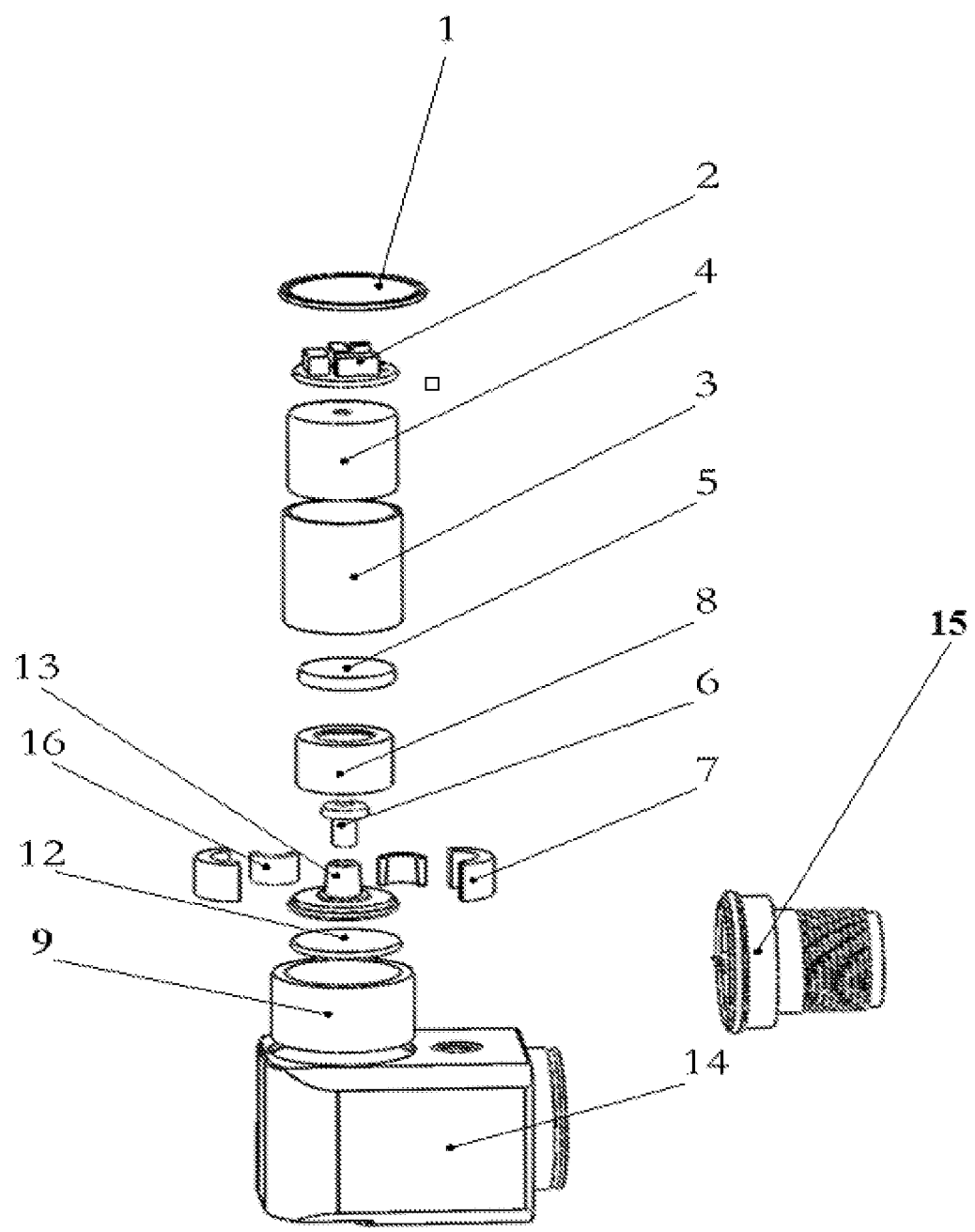
FIG. 2 is an exploded view of the lightning-proof piezoelectric acceleration sensor.
Figure 3:
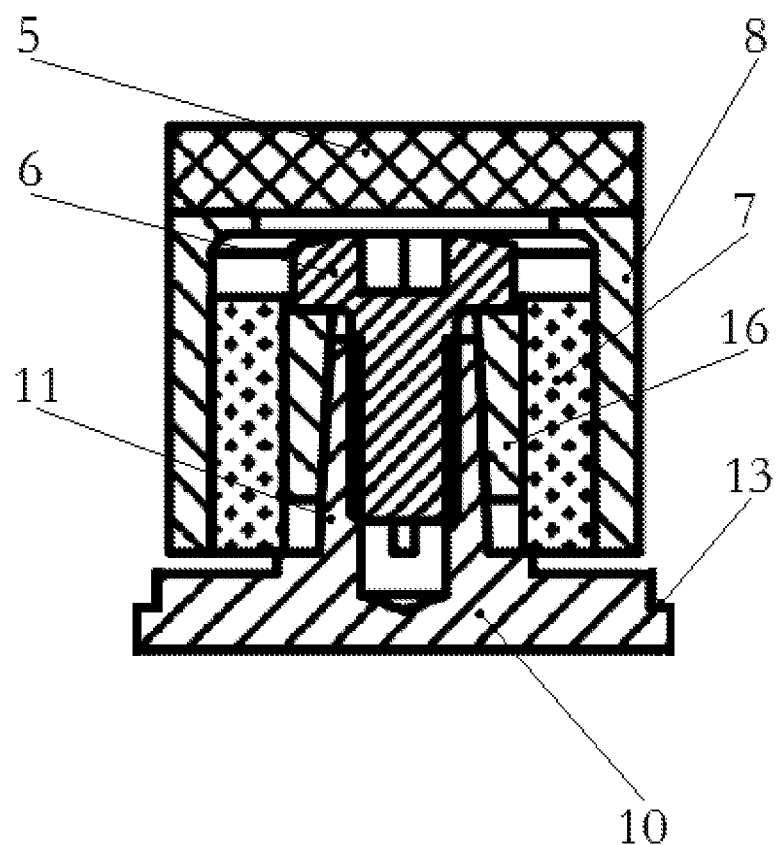
FIG. 3 is a structural schematic diagram of the core assembly shown in FIG. 1.

As shown in FIG. 1 to FIG. 3, the lightning-proof piezoelectric acceleration sensor of the present embodiment, with an external connector transversely arranged, comprises a housing 14, a core assembly, alumina ceramics 12, a shielding cover 4, a lightning-proof circuit board 2 and a heat-shrinkable sleeve 3, the alumina ceramics 12 has one end fixedly connected to the core assembly and the other end fixedly connected to an inner wall of the housing 14, so that there is enough creepage distance between the core assembly and the inner wall of the housing 14; the shielding cover 4 is sleeved outside the core assembly, with a preset gap between an upper end of the shielding cover 4 and the core assembly, so that the shielding cover 4 does not interfere with the core assembly, and the shielding cover 4 has an open end oriented towards the alumina ceramics 12, so that the shielding cover 4 together with the alumina ceramics 12 encloses the core assembly for resisting external electromagnetic noises; a through-hole is provided in the upper end of the shielding cover 4, and a connection wire connecting the lightning-proof circuit board 2 to the core assembly passes through the through-hole, the lightning-proof circuit board 2 is fixedly provided on an upper end of the shielding cover 4 and is electrically connected to the external connector and the core assembly respectively, so that the lightning-proof piezoelectric acceleration sensor has a compact structure, the lightning-proof circuit board 2 clamps surge voltage; the heat-shrinkable sleeve 3 is sleeved outside the shielding cover 4 and has a lower end connected to the housing 14 and an upper end situated higher than the shielding cover 4, so that the creepage distance between the housing 14 and the shielding cover 4 is increased; insulation silica gel 9 having a preset height is filled between the heat-shrinkable sleeve 3 and the housing 14, an upper end of insulation silica gel 9 is situated above the shielding cover 4, the insulation silica gel 9 further increases the creepage distance between the housing 14 and the shielding cover 4, therefore, the lightning-proof piezoelectric acceleration sensor has even better lightning-proof effect. Hence, by the arrangement of the alumina ceramics 12, the heat-shrinkable sleeve 3, the insulation silica gel 9 and the lightning-proof circuit board 2, the lightning-proof piezoelectric acceleration sensor of the present embodiment has better lightning-proof effect.

Wherein, the lightning-proof circuit board 2 comprises a Transient Voltage Suppressor (TVS) tube, a gas discharge tube and a resistor, wherein the TVS tube clamps surge voltage to 22V, the gas discharge tube absorbs large current inputted from outside, the resistor absorbs residual voltage, the TVS tube, the gas discharge tube and the resistor are integrated on the circuit board, so that the lightning-proof elements have a compact structure.

Wherein, the alumina ceramics 12 has good mechanical strength, so that damage due to vibration and impact can be prevented when the acceleration is measured. The alumina ceramics 12 has a cylindrical shape with a diameter size equal to that of the support portion 10, both a peripheral wall of the support portion 10 and a peripheral wall of the insulation sheet are connected with the heat-shrinkable sleeve 3, so that the heat-shrinkable sleeve 3 firmly wraps the base member, the insulation sheet and the shielding cover 4, making the entire apparatus structure more compact.

Wherein, the core assembly comprises a base member, a piezoelectric member 7, a mass block member 8, a pre-tightening member and a locking member 6, the base member is fixedly connected to one end of the alumina ceramics 12 and comprises a support portion 10 and a columnar connection portion 11 arranged on the support portion 10, the connection portion 11 is provided with a mounting hole extending along an axis of the connection portion 11, the piezoelectric member 7 is sleeved outside the connection portion 11 with an annular gap formed between the piezoelectric member 7 and the connection portion 11, the mass block member 8 is sleeved outside the piezoelectric member 7 with no clearance formed therebetween and forms a clearance with the shielding cover 4, the pre-tightening member, being a wedge block 16, is inserted in the annular gap and has a thinner end close to the support portion 10, the locking member 6 comprises a columnar part and a stopper part connected to each other, the columnar part cooperates with the mounting hole to lock the base member, the piezoelectric member 7, the mass block member 8 and the pre-tightening member, the stopper part presses on one end of the pre-tightening member, so as to cause the pre-tightening member to apply a radial pre-tightening force to tighten the piezoelectric member 7, the mass block member 8 and the base member.

When mounting the core assembly, the columnar part cooperates with the mounting hole to lock the base member, the piezoelectric member 7, the mass block member 8, the pre-tightening member and the locking member 6 together, and as the pre-tightening member is a wedge block 16 inserted in the annular gap formed between the piezoelectric member 7 and the connection portion 11, when pressed by the stopper part, the wedge block 16 causes the piezoelectric member 7 and the mass block member 8 to be tightly connected, thus, when using the core assembly, an inertia force of the mass block member 8 is acted on the piezoelectric member 7 to generate electric charge, a signal conditioning circuit board 5 is connected to the piezoelectric member 7, so that the electric charge is introduced into the signal conditioning circuit board 5 to be processed. There is a clearance between the mass block member 8 and the shielding cover 4, so that the shielding cover 4 is prevented from interfering with the mass block member 8. The piezoelectric member 7 described in this embodiment is piezoelectric ceramics.

Wherein, an inner annular surface of the pre-tightening member has a shape of a circular truncated cone with a slope of 86-88 degrees. When a certain force is acted by the stopper part on the wedge block 16, a larger angle of slope makes it easier for the wedge block 16 to be inserted into the annular gap, and analysis shows that the core assembly has optimal performance when the circular truncated cone has a slope of 86-88 degrees.

The external connector in this embodiment is a high-voltage endurance double-core connector 15 comprising an outer shell and PIN needles, the outer shell is made of stainless steel, the PIN needles are connected to the outer shell by glass sintering, thereby ensuring enough creepage distance among the respective PIN needles as well as between the PIN needles and the outer shell, so that, when subjected to lightning strike, there would be no spark or flashover produced between the respective PIN needles and the outer shell of the connector.

A lower end of the support portion 10 is an annular flange, and the open end of the shielding cover 4 abuts against a flange surface 13 of the annular flange. When mounting the lightning-proof piezoelectric acceleration sensor, the core assembly is fixedly attached to the alumina ceramics 12, the signal conditioning circuit board 5 is adhered to the mass block member 8, and then the core assembly and the signal conditioning circuit board 5 are wrapped by the shielding cover 4, the open end of the shielding cover 4 abuts against a flange surface 13 of the annular flange, so that the clearance between the shielding cover 4 and the base member is reduced, which is beneficial for resisting external electromagnetic noises, the shielding cover 4 is welded to the base member of the core assembly, the lightning-proof circuit board 2 is situated on the shielding cover 4, the heat-shrinkable sleeve 3 is used to wrap the base member, the shielding cover 4 and the lightning-proof circuit board 2, and then the base member, the shielding cover 4 and the lightning-proof circuit board 2 wrapped by the heat-shrinkable sleeve 3 are put inside the housing 14, the insulation silica gel 9 is filled therein and cured after the inside of the housing is sufficient vacuumized, the upper cover 1 is mounted, and finally, the high-voltage endurance double-core connector 15 is welded thereon.

Apparently, the above embodiments are merely examples illustrated for giving a clear description, rather than limiting the implementation ways thereof. For a person with ordinary skill in the art, various changes and modifications in other different forms can be made on the basis of the above description. It is unnecessary and impossible to exhaustively list all the implementation ways herein. However, any obvious changes or modifications derived from the above description are intended to be embraced within the protection scope of the present application.

What is claimed is:

1. A lightning-proof piezoelectric acceleration sensor, comprising:
    a housing;
    a core assembly, provided inside the housing;
    an insulation sheet, having one end fixedly connected to the core assembly and the other end fixedly connected to an inner wall of the housing;
    a shielding cover, sleeved outside the core assembly, and having an open end oriented towards the insulation sheet;
    characterized in further comprising:
    a lightning-proof circuit board, fixedly provided on an upper end of the shielding cover, and electrically connected to an external connector and the core assembly respectively;
    a heat-shrinkable sleeve, sleeved outside the shielding cover, and having a lower end connected to the housing and an upper end situated higher than the shielding cover; and
    insulation material, having a preset height and filled between the heat-shrinkable sleeve and the housing.

2. The lightning-proof piezoelectric acceleration sensor of claim 1, wherein, an upper end of the insulation material is situated above the shielding cover.

3. The lightning-proof piezoelectric acceleration sensor of claim 1, wherein, the lightning-proof circuit board comprises a Transient Voltage Suppressor (TVS) tube, a gas discharge tube and a resistor integrated thereon.

4. The lightning-proof piezoelectric acceleration sensor of claim 1, wherein, the insulation sheet is alumina ceramics.

5. The lightning-proof piezoelectric acceleration sensor of claim 1, wherein, a preset gap is provided between the upper end of the shielding cover and the core assembly, a through-hole is provided in the upper end of the shielding cover, and a connection wire connecting the lightning-proof circuit board to the core assembly passes through the through-hole.

6. The lightning-proof piezoelectric acceleration sensor of claim 1, wherein, the core assembly comprises
    a base member, fixedly connected to one end of the insulation sheet, and comprising
        a support portion, and
        a columnar connection portion arranged on the support portion and provided with a mounting hole extending along an axis thereof;
    a piezoelectric member, sleeved outside the connection portion, with an annular gap formed between the piezoelectric member and the connection portion;
    a mass block member, sleeved outside the piezoelectric member with no clearance formed therebetween, and forming a clearance with the shielding cover;
    a pre-tightening member, being a wedge block (16), inserted in the annular gap, and having a thinner end close to the support portion;
    a locking member, comprising
        a columnar part cooperating with the mounting hole to lock the base member, the piezoelectric member, the mass block member and the pre-tightening member, and
        a stopper part connected to columnar part and pressing on one end of the pre-tightening member, so as to cause the pre-tightening member to apply a radial pre-tightening force to tighten the piezoelectric member, the mass block member and the base member.

7. The lightning-proof piezoelectric acceleration sensor of claim 6, wherein, an inner annular surface of the pre-tightening member has a shape of a circular truncated cone with a slope of 86-88 degrees.

8. The lightning-proof piezoelectric acceleration sensor of claim 6, wherein, the support portion has a diameter size equal to that of the insulation sheet, both a peripheral wall of the support portion and a peripheral wall of the insulation sheet are connected with the heat-shrinkable sleeve.

9. The lightning-proof piezoelectric acceleration sensor of claim 6, wherein, a lower end of the support portion is an annular flange, and the open end of the shielding cover abuts against a flange surface of the annular flange.

10. The lightning-proof piezoelectric acceleration sensor of claim 9, wherein, the shielding cover is welded to the support portion.

* * * * *